US005247424A

United States Patent [19]

Harris et al.

[11] Patent Number: 5,247,424

[45] Date of Patent: Sep. 21, 1993

[54] LOW TEMPERATURE CONDUCTION MODULE WITH GASKET TO PROVIDE A VACUUM SEAL AND ELECTRICAL CONNECTIONS

[75] Inventors: Willard S. Harris, Red Hook; Matthew A. Hutchinson, Cortland; Richard R. Konian; Edward J. Ossolinski, both of Poughkeepsie; Vincent C. Vasile, Marlboro, all of N.Y.

[73] Assignee: International Business Machines Corporation, Armonk, N.Y.

[21] Appl. No.: 899,414

[22] Filed: Jun. 16, 1992

[51] Int. Cl.[5] .................... H05K 7/20; H01R 13/533

[52] U.S. Cl. .................................... 361/704; 277/901; 439/271; 174/52.3; 361/749; 361/752; 361/785; 361/816

[58] Field of Search .................... 174/52.3, 65 R, 151, 174/254, 268; 277/901; 361/386-389, 398, 395, 399, 413, 424; 439/271-272, 275, 278-279, 587, 604, 736

[56] References Cited

U.S. PATENT DOCUMENTS

| | | | |
|---|---|---|---|
| 4,161,655 | 7/1979 | Cotic et al. | 250/385 |
| 4,196,467 | 4/1980 | Jakob et al. | 174/52.3 |
| 4,723,196 | 2/1988 | Hofmeister et al. | 174/52.3 |
| 4,763,223 | 8/1988 | Tang | 361/380 |
| 4,814,943 | 3/1989 | Okuaki | 361/400 |
| 4,931,854 | 6/1990 | Yonemasu | 357/74 |
| 5,035,637 | 7/1991 | Mathews et al. | 439/271 |

*Primary Examiner*—Gregory D. Thompson
*Attorney, Agent, or Firm*—Laurence R. Letson; Lawrence D. Cutter

[57] ABSTRACT

A gasket is fabricated with electrical flex cables extending through the gasket in order to electrically communicate from the outside of a vacuum chamber with the electrical devices positioned within a vacuum chamber of a cryogenically cooled module. The gasket is fabricated from elastomeric, dielectric materials such as neoprene to effect a seal between the portions of the vacuum chamber and also to seal between the gasket material and the conductors of the flex cables which pass through the gasket.

17 Claims, 2 Drawing Sheets

LOW TEMPERATURE CONDUCTION MODULE WITH GASKET TO PROVIDE A VACUUM SEAL AND ELECTRICAL CONNECTIONS

FIELD OF THE INVENTION

This invention relates to low temperature conduction modules, such as are used in computers, which having cooling systems which utilize a chilled or cryogenic cooling fluid and, more specifically, to the seal of the module containing the electronic elements so that a high level vacuum may be maintained in the module in order to maintain a high level vacuum in the low temperature conduction module.

BACKGROUND OF THE INVENTION

In the manufacture of large, high speed computers, it is necessary to cool the electronic components and devices which form a portion of the processor to a very low operating temperature, and to operate these components in a vacuum. In order to cool the components, it is necessary to mount the components in contact with a thermally conductive structure which then is cooled to a very low temperature. This low temperature cooling may be accomplished by cryogenic cooling unit, which utilizes a low temperature gas or liquid, such as gaseous Helium, at approximately 77 degrees Kelvin (K.) as the cooling vehicle circulated in the cryogenic cooling unit which is placed underneath and in contact with the cold plate of a vacuum container. In order to prevent problems with moisture in the air condensing as the electronics are cooled to such a low temperature, a vacuum is formed surrounding the electronic elements within a sealed vacuum container.

Sealed vacuum containers are well known. However, it has been a problem to maintain the vacuum when a path of electrical communication must pass through the walls and into the evacuated region of the container. Attempts have been made to form a container which has a plurality of apertures in its periphery and to form a seal around a rigid circuit board. The circuit board is then connected to a flexible cable on both ends. The sealing is accomplished by a rigid potting compound such as epoxy as it passes through the wall aperture formed in the wall of the container. An example of such a structure is found in Research Disclosure, February 1988, page 92.

Efforts to provide seals at the container walls which allow conductors or cabling to pass through the walls has proven to be unreliable, since movement of the sealing and conducting structure may break the seal and destroy the vacuum.

Further, the use of connectors, which may be part of the sealing arrangement, to seal the apertures in the cooling unit wall require precision manufacturing and greatly increase the cost of such a cryogenically cooled module.

Electrical communication from the exterior to the interior of a chamber may be accomplished as shown in U.S. Pat. No. 4,161,655 to Cotic et al.; a circuit board is trapped between sealing rings and gaskets formed of neoprene to seal the interior chamber. The neoprene ring gaskets are mounted in and retained in a metal gasket carrier or ring on each side of a printed circuit board. The circuit board of Cotic et al.; is not molded into the gasket rings of neoprene but relies strictly upon the surface of the neoprene ring being compressed against the surface of the circuit board sufficient to create an adequate seal for the containment of the gas contained in the chamber.

Another technique for sealing a container, within which electronic elements or circuits are contained, involves the use of sealing glass such as that disclosed in U.S. Pat. No. 4,931,854 to Yonemasu et al.; an integrated circuit package is sealed by the use of sealing glass and the fusing of that glass to form the seal between the base and cover and surrounding the leads leading to the integrated circuit. The cooling of the assembly to very low temperatures may crack the glass seal if the package shrinks at a different rate than the glass.

Resins such as epoxy, silicone, polyimide and the like may be used to encapsulate an electronic device and to seal that device from the surrounding atmosphere. This approach is shown in U.S. Pat. No. 4,814,943 to Okuaki, where there is no effort to either pressurize or evacuate the container.

SUMMARY OF THE INVENTION

It is an object of this invention to enhance the seal between the portions of a vacuum module containing electronic elements or devices, while at the same time providing conductive paths between the exterior and interior of the module.

It is a further object of the invention to simplify the manufacture of the module and to improve the capability of the module to maintain a satisfactory vacuum.

The foregoing objects are accomplished by removing the insulation from a short segment of flex cable conductors, exposing the wires within the insulation and then to mold the exposed wire portion into an elastomeric, dielectric gasket of a desired shape. This leaves the flex cable extending both from the interior and the exterior surfaces of the gasket and the ends of the flex cable then may be connected to a connector on the outside and terminated appropriately on the interior to electronic devices contained within the vacuum chamber.

The gasket then is placed between the two shell portions of the vacuum vessel and clamped therebetween to insure an air tight seal.

By passing the electrical conductors of the cables through the gasket material at the junction between two portions of the vacuum chamber, it becomes unnecessary to otherwise penetrate the walls of the vacuum chamber. Accordingly, this improves the capability of the vacuum chamber to maintain a desired vacuum level over the life of the device.

The details of the fabrication of such an arrangement will become clear with reference to the drawings and the following detailed description of the best mode of the preferred embodiment for carrying out the invention.

DRAWINGS

DETAILED DESCRIPTION OF THE BEST MODE OF PREFERRED EMBODIMENT FOR CARRYING OUT THE INVENTION

Figure 1:
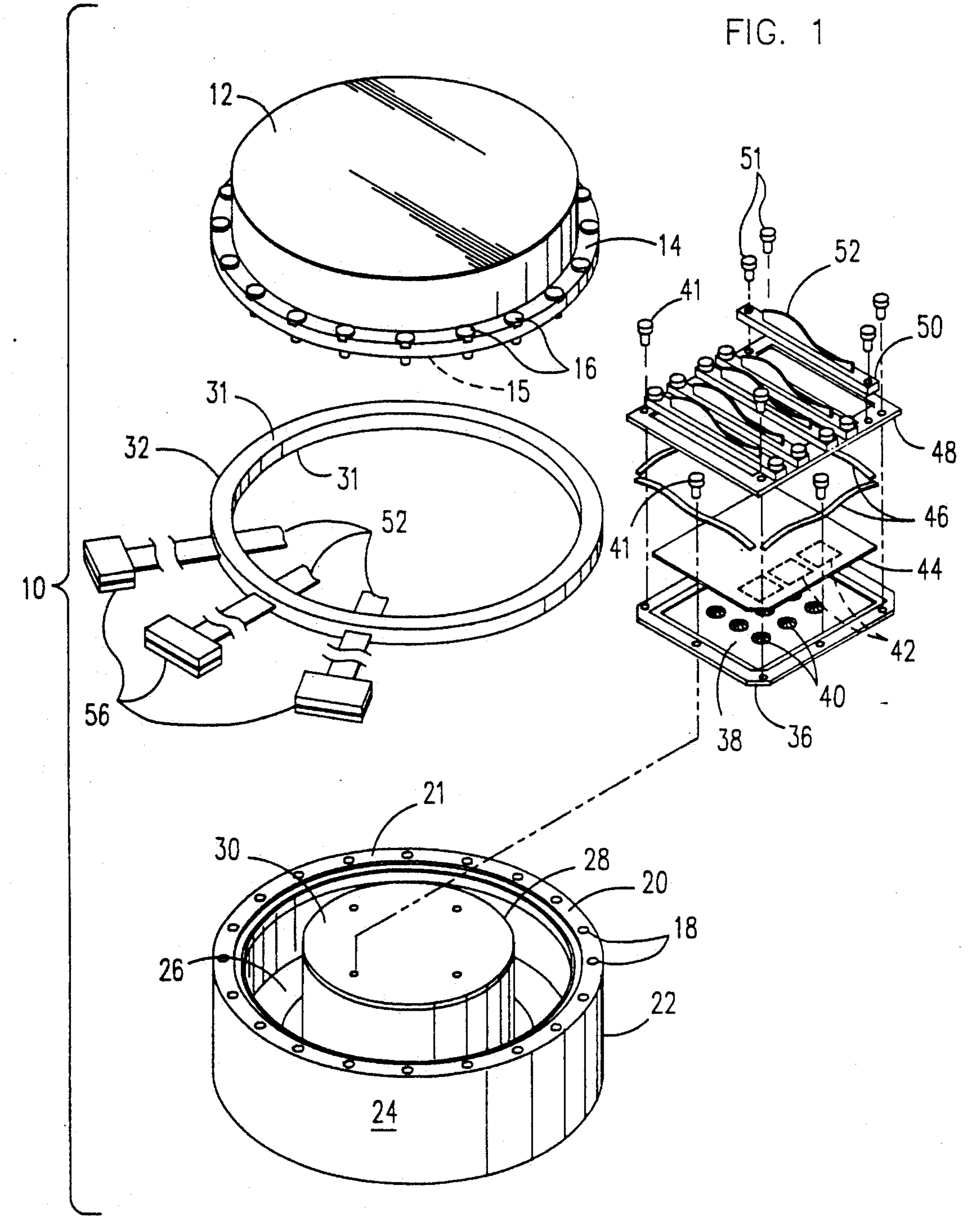
FIG. 1 is an exploded view of the cryo-cooled module utilizing the gasket with the electrical flex cables extending therethrough.

Referring to FIG. 1, a cryogenically cooled module 10, hereafter referred to as a cryo-cooled unit 10, is illustrated in an exploded form. The top shell of the cryo-cooled unit 10 is a metal shell, generally cylindrical, having a flange 14 surrounding the open end of shell 12. Extending through the flange 14 are a plurality of bolts 16 which will mate with the holes 18 in the rim 20 of the cryo-cooled unit 22. The cryo-cooled unit 22 is comprised of an outer shell 24, an annularly shaped floor 26, and a raised pedestal portion 28. The top of the raised pedestal portion 28 is a cold plate 30. All of the elements of the top shell 12 and the bottom base 22 are fabricated in such a manner that when the top shell 12 and base 22 are joined with a suitable sealing gasket 32, the enclosure will be air tight. Gasket 32, in the preferred embodiment, is an annular ring of an elastomeric, dielectric material such as neoprene rubber or other similar material. One consideration in selection of these materials is that the materials will not out-gas solvents or gases from the gasket; the out-gassing products would contaminate the vacuum chamber of the module 10.

In order to connect the electronic devices 42 contained within the module 10 to electronic devices 42 which reside outside the module 10, it is necessary to provide conductors 54 which extend from the exterior of the module 10 to the interior thereof, while simultaneously preventing the loss of vacuum which is pulled or created on the module 10 during manufacture and assembly.

An example of an electronics assembly for inclusion within the cryo-cooled module 10 is illustrated as part of FIG. 1. The mounting frame 36 attaches to cold plate 30. A plurality of radial fingers 40 formed and bent to form cantilevered spring fingers 40 contact the electronic chips 42 which are carried on the underside of module plate 44. The radial fingers 40 are part of and extend from a plate 38 and conduct heat to plate 38, which is in contact with cold plate 30.

The top surface of module plate 44 is engaged, about its periphery, by a plurality of springs 46. The springs 46 are typically flat leaf spring 46 which when trapped between clamping plate 48 and plate 44 press on the module plate 44 and urge chips 42 into contact with the cantilever spring fingers 40.

The spring fingers 40 assure that there is a physical contact for conduction of heat from the chips 42 to the cold plate 30. The clamping plate 48 not only serves a clamping function in forcing the plate 44 and chips 42 downward toward the cold plate 30; but, it also supports strain reliefs 50 through which the flex cables 52 extend providing the electrical connections to electrical devices outside the cryo-cooled module 10.

Strain reliefs 50 are clamped or fixed in a conventional manner to the flex cable 52 and mounted by screws 51 or other conventional fastening techniques to the clamping plate 48. In order to connect the flex cable 52 with electrical devices located outside the cryo-cooled module 10, it is necessary to pass the discreet electrical conductive paths or wires 54 through the confines of the cryo-cooled module 10.

Figure 3:
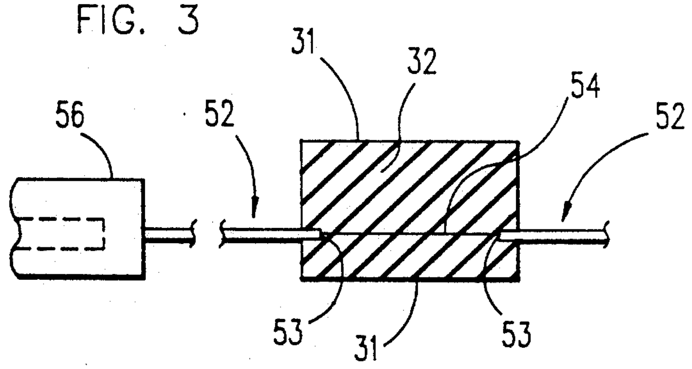
FIG. 3 is a detailed illustration of a cross-section of the gasket and flex cables passing therethrough.
Figure 4:
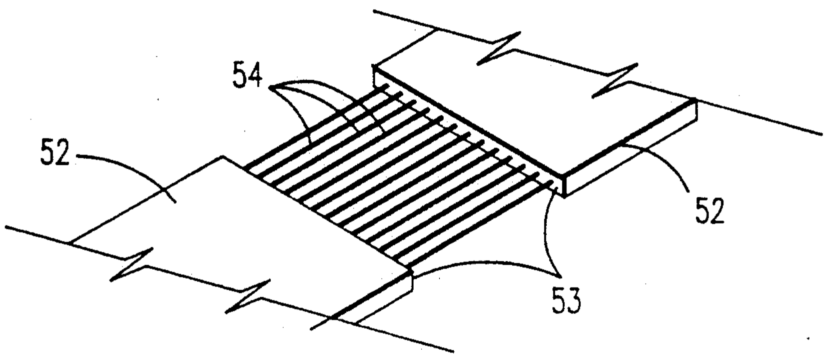
FIG. 4 illustrates the flex cable with the insulation removed and prior to encapsulation by the gasket material.

In order to do that, the flex cable 52 is etched to remove a section of insulation 53 thereby exposing the conductors or wires 54 as can be seen in FIG. 4. After the wires 54 have been exposed, the flex cable 52 is supported in a mold and a liquid or uncured elastomeric, dielectric material, such as neoprene rubber, is used to fill the mold to form the annular ring of the gasket 32. As can be seen from FIG. 3, the wires 54 of the flex cable 52 are then encapsulated in the neoprene rubber or other dielectric, elastomeric material and insulated from each other as well as from the shell 12 and the base 22 of the cryo-cooled module 10. The flex cable 52 may be terminated in a suitable connector 56 in a conventional manner to provide ease of connection and disconnection of the electronic devices 42 within the cryo-cooled unit 10.

Figure 2:
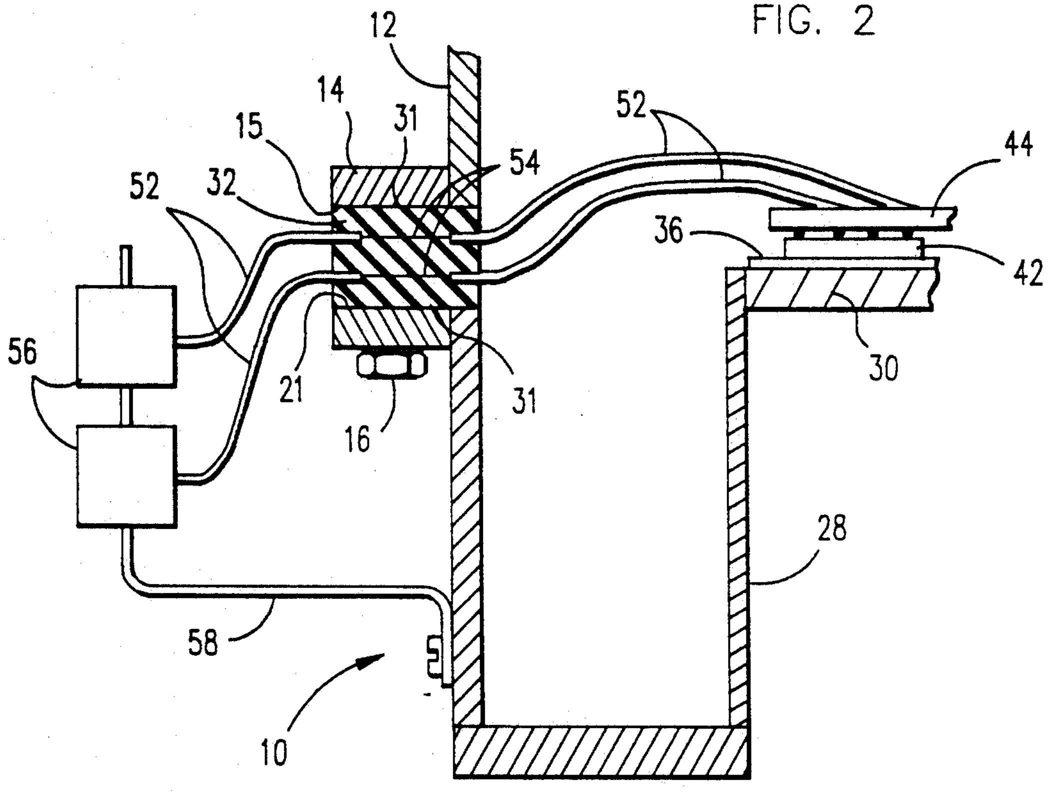
FIG. 2 is a cross-sectional view of a portion of the cryo cooling unit illustrating the structure of the cryo cooling unit and the gasket with the flex cable passing therethrough.

Referring to FIG. 2, the connector 56 is preferably supported by a connector bracket 58 attached to the exterior wall 24 of the base 22. The connector bracket 58 provides not only a support but stabilization for connector 56 and the flex cable 52 to prevent undue movement of the flex cable 52 as it enters and passes through the gasket 32 to the interior chamber of the cryo-cooled module 10.

As can be seen in FIG. 2, flex cable 52 extends from connector 56 through gasket 32 and into the interior chamber of the cryo-cooled module 10. The flex cable 52 terminates at the module plate 44 which supports chips 42 and pushes chips 42 against spring fingers 40.

Mounting frame 36 is attached by bolts or screws 41 to the cold plate 30 which is, in turn, cooled by a cryo-cooler unit of the Gifford-McMahon or Stirling cycle type, which are commercially available from various manufacturers (not shown). Cold plate 30 typically assumes temperatures of 70 degrees Kelvin (K.) to 80 degrees K., approximating the temperature of the coolant in the cryo-cooler. Substantially, the remainder of the cryo-cooled module 10 is maintained at room temperature with the exception of the upstanding portion of the pedestal 28 which will have, of necessity, a temperature gradient.

During manufacture, when the unit 10 is assembled, it is evacuated to the point where a vacuum of $10^{-3}$ to $10^{-5}$ TOR is drawn on the volume contained within module 10; then the module 10 is sealed. It is necessary to maintain a high vacuum for the life of the apparatus and, therefore, a very effective seal between the shell 12 and base 22 is essential. Likewise, the seal between the gasket 32 and the individual conductors 54 extending through gasket 32 is essential to maintain the operating vacuum necessary.

Although only three flex cables 52 passing through gasket 32 have been illustrated in FIG. 1, for clarity, and two flex cables 52 have been illustrated passing through gasket 32 in FIG. 2, it is readily apparent that a relatively large number of flex cables 52 with a significant number of conductors 54 may be molded into gasket 32 and that there exist large numbers of discreet conductors 54 passing from the exterior to the interior of cryo-cooled module 10.

The clamping or compressing action of bolts 16 when threaded into holes 18 and tightened will act to force the sealing surfaces 15 and 21 of flange 14 and rim 20 into intimate sealing contact with the sealing surfaces 31 of gasket 32. Further compression of gasket 32 will enhance the seal between the gasket 32 material and conductors 54 at the point they pass through the gasket 32.

Inasmuch as the exterior wall 24 of base 22 and the top or shell 12 are at approximately ambient temperature, gasket 32 will remain at approximately ambient temperature and, accordingly, the selection of materials need not consider the effects of extreme cold on the elastomeric material selected.

By using flex cables 52, any force or movement applied to connectors 56 will be isolated from the junction of flex cable 52 and gasket 32, thereby preventing the movement of the flex cable 52 at that region with the possibility of destroying the vacuum seal necessary for proper operation of the cryo-cooled unit 10.

The removal of the insulation 53 at the region where the wires 54 contact the gasket 32 helps eliminate one possible leakage route for air to enter the vacuum region of the cryo-cooled module 10. Secondarily, the etching away of the insulation may advantageously affect the surfaces of the individual wires 54 to create a surface which is more easily bonded by the elastomeric material from which gasket 32 is made. If polyvinylchloride (PVC) is used as the insulation 53, etching may be accomplished by using tetrahydrofuran (THF) to dissolve or remove the insulation 53. Other appropriate types of solvents would be used to dissolve other types of insulations.

Care should be taken not to expose the individual conductors to the atmosphere when assembled and, therefore, the insulation 53 on the flex cable 52 should extend a distance into the elastomeric materials of gasket 32 and be encapsulated by the gasket 32.

The number of the individual flex cables 52 that may be molded into and become a part of gasket 32 will depend upon the number of conductors 54 needed to connect the electronic devices 42 within the cryo-cooled module 10 and the number of flex cables 52 which may be vertically positioned within the thickness of gasket 32, and the size of the gasket.

As can be seen from the foregoing, the routing of the electrical conductors 54 which are necessary to make connections with the electronic devices 42 within the cryo-cooled module 10, through the gasket 32 thus eliminates the complexity of forming apertures in the walls of the cryo-cooled module 10, and then assuring that each of the devices which would then be necessary to pass the cables through those apertures are properly and adequately sealed to prevent the loss of vacuum within the cryo-cooled module 10.

The physical integrity of the entire cryo-cooled unit 10 is greatly enhanced by using the gasket 32 as the sealing component for the top 12 and base unit 22 as well as the sealing component to seal the electrical conductors 54 passing into the cryo-cooled module 10.

It will be understood that changes and modifications may be made to this disclosed invention without departing from the scope of the claims.

We claim:

1. A vacuum container for enclosing electronic devices and maintaining a vacuum surrounding said devices, comprising a first shell having a first sealing surface;

a second shell having a second sealing surface;

a unitary gasket having a shape conforming to said first and second sealing surfaces of said shells for preserving vacuum conditions within said shells;

said gasket formed of an elastomeric, dielectric material;

said first and second shells disposed proximate to each other and with said sealing surfaces in contact with said gasket and said elastomeric, dielectric material in surface-to-surface contact with said first and second sealing surfaces;

flexible electrical conductors having a first and second ends and extending from outside said shells to inside said shells through said gasket, said electrical conductors surrounded by and in intimate surface-to-surface contact with said elastomeric, dielectric gasket material;

said gasket and said flexible conductors disposed between said sealing surfaces to seal said container;

a connector attached to at least one of said first and second ends of said flexible conductors, whereby said conductors are sealed within said gasket for maintaining said vacuum within said container and provide electrical conduction paths from outside said container to within said container without disturbing said vacuum.

2. The container of claim 1 wherein said flexible conductors are wires of a flat flexible ribbon cable with said wires being without said insulation in a region where said conductors extend through said gasket.

3. The container of claim 2 wherein said gasket is formed around and sealed to said flexible conductors.

4. The container of claim 3 further comprising a holding means, wherein said holding means further comprises clamping means for compressing said gasket intermediate said shells.

5. A low-temperature, high-vacuum container for maintaining a sealed environment for electronic devices comprising:

first and second shell portions each having at least an internal surface and enclosing electronic devices;

said shell portions formed of a thermally conductive material;

a unitary elastomeric, dielectric gasket intermediate said shell portions and sealingly engaging said first and second shell portions for maintaining vacuum conditions within said container;

said gasket having a plurality of electrical conductors extending through, surrounded by and in intimate surface-to-surface sealing contact with said unitary, elastomeric, dielectric gasket;

said conductors connected to said electronic devices;

said electronic devices mounted on one of said interior surfaces of said container and in thermally conductive communication with said one internal surface, whereby at least a portion of said container may be cooled to a low-temperature to effect the conduction of heat from said electronic devices to one of said shell portions.

6. The container of claim 5 wherein said conductors are wires of a flat ribbon cable with said wires being without said insulation in a region where said conductors extend through said gasket.

7. The container of claim 6 wherein said gasket is formed around and sealed to said conductors.

8. The container of claim 7 wherein said first and second shell portions further comprise clamping means for clamping and compressing said gasket intermediate said shell portions.

9. A gasket for sealing a container having two shell portions and for providing electrical connections between electronic devices within said container and electronic devices outside said container, comprising:

a plurality of conductors having a length, two ends, wires and insulation surrounding said wires in regions extending from each of said two ends and terminating to leave said wires exposed for a portion of said length;

elastomeric, dielectric material formed in a shape of a unitary gasket having sealing surfaces for engagement with said shell portions;

one end and a portion of each said wires extending to within a region circumscribed by said gasket and a second end and a portion of each of said wires disposed outside said region and said gasket;

said elastomeric dielectric material of said unitary gasket surrounding said conductors at said exposed portion of said length of exposed wire and sealingly adhered to said wires in surface-to-surface engagement, thereby forming an air tight seal between said wires and said elastomeric material.

10. The gasket of claim 9 wherein said conductors comprise a flat ribbon cable.

11. The gasket of claim 10 wherein said conductors comprise connection means for connecting said wires to said electronic devices outside said container.

12. A gasket for sealing a vacuum container and conducting electrical signals through said gasket, comprising:

a dielectric, elastomeric material forming a deformable unitary gasket;

a flat flexible cable molded into said deformable gasket, said dielectric, elastomeric material of said gasket disposed in surface-to-surface engagement with and forming a seal with said flat flexible cable with ends inside and outside a vacuum container sealed by said gasket;

means for directly coupling one end of said flat cable to electronic devices within a vacuum container, sealed by said gasket.

13. The gasket of claim 12 wherein said flat flexible cable comprises a plurality of conductive wires having ends and insulation surrounding each of said wires, in regions proximate one of said ends and extending toward another of said ends, but leaving a portion of said wires with no insulation where said wires pass through said gasket and are sealed to said gasket.

14. A method of vacuum sealing a cryogenically cooled container, the method comprising the steps of:

providing a first and second portions of said cryogenically cooled container;

providing a multi-conductor ribbon cable having insulation and two ends;

removing said insulation from a portion of said multiconductor cable to expose said conductors in a region intermediate said ends;

forming a unitary gasket of an elastomeric, dielectric material in surface-to-surface engagement surrounding said flat cable at a region including said exposed conductors;

disposing said gasket between said first and second portions of said cryogenically cooled container;

compressing said gasket between said portions of said container; and creating a vacuum within said container.

15. The method of claim 14 wherein said step of removing insulation includes the step of chemically etching said insulation until said insulation is removed in a desired region.

16. The method of claim 14 comprising the further step of cooling a portion of said container to a low temperature.

17. A method of preparing electrical components for operation within a vacuum and at a cryogenic temperature comprising the steps of:

providing a first and second portions of a cryogenically cooled container;

providing a multi-conductor ribbon cable having insulation and two ends;

removing said insulation from a portion of said multiconductor cable to expose said conductors in a region intermediate said ends;

forming a gasket of an elastomeric, dielectric material surrounding in surface-to-surface engagement said flat cable at a region including said exposed conductors;

disposing said gasket between said first and second portions of said cryogenically cooled container;

compressing said gasket between said portions of said container;

evacuating said container, installing said electrical components on a surface of at least a portion of said container, and cooling at least said portion of said container to a low temperature.

* * * * *